United States Patent [19]
Freygang et al.

[11] 3,942,099
[45] Mar. 2, 1976

[54] MEASURING TRANSFORMER WITH A CAPACITOR BUSHING

[75] Inventors: Hans-Joachim Freygang, Berlin, Germany; Gabor Kovacs, Vienna, Austria

[73] Assignee: Siemens Aktiengesellschaft, Munich, Germany

[22] Filed: May 17, 1974

[21] Appl. No.: 470,907

[30] Foreign Application Priority Data
May 17, 1973  Germany............................ 2325440

[52] U.S. Cl.......... 323/44 R; 174/142; 174/DIG. 10; 307/147; 307/149; 336/174; 336/175; 323/74; 323/93
[51] Int. Cl.²..................... H01F 27/06; H01B 9/06
[58] Field of Search..... 307/147, 149; 174/DIG. 10, 174/142, 143; 336/173, 174, 175; 315/255; 324/126, 127; 317/103; 323/93, 44 R, 60, 61, 74

[56] References Cited
UNITED STATES PATENTS

| | | | |
|---|---|---|---|
| 1,873,977 | 8/1932 | Naef............. | 174/DIG. 10 |
| 3,701,944 | 10/1972 | Amalric.............. | 324/126 |
| 3,763,378 | 10/1973 | Muller............... | 323/93 X |
| 3,829,742 | 8/1974 | Muller............... | 323/93 X |

FOREIGN PATENTS OR APPLICATIONS
259,231  8/1927  United Kingdom.......... 174/DIG. 10

*Primary Examiner*—Gerald Goldberg
*Attorney, Agent, or Firm*—Kenyon & Kenyon Reilly Carr & Chapin

[57] ABSTRACT

A measuring transformer arrangement with a capacitor bushing and devices for measuring voltage and current associated with the capacitor bushing is suitable for use in a high-voltage installation with metal encapsulation carrying several high-voltage conductors. The capacitor bushing provided for each high-voltage conductor is arranged in a bulkhead partition of the metal encapsulation and carries a current measuring device which includes at the periphery of the bushing at least one current transformer core with a secondary winding system mounted thereon.

6 Claims, 2 Drawing Figures

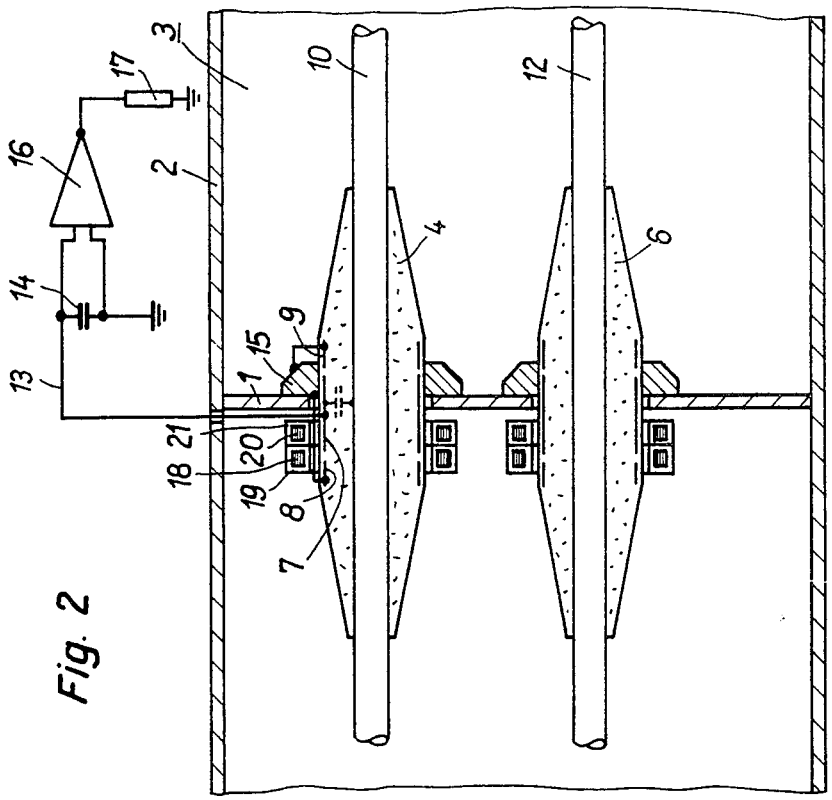
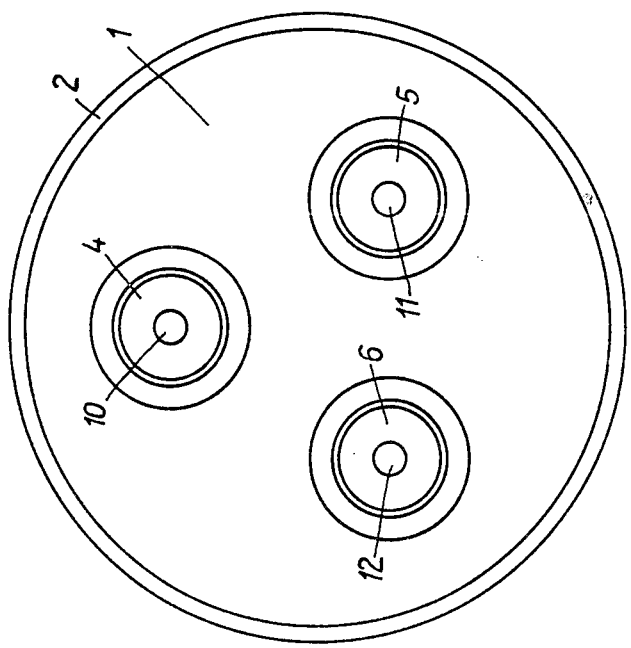

MEASURING TRANSFORMER WITH A CAPACITOR BUSHING

BACKGROUND OF THE INVENTION

The invention relates to a measuring transformer with a capacitor bushing and with devices for measuring voltage and current associated with the capacitor bushing.

A measuring transformer of this kind is disclosed in Czechoslovakian Pat. No. 437,521 and includes semiconductor arrangements which respond to the magnetic or the electrostatic field of the capacitor bushing and are attached in or at the capacitor bushing. At amplifiers following these arrangements, measurement quantities can then be taken off which are proportional to the current as well as to the voltage in or on the high-voltage conductor extending through the capacitor bushing.

SUMMARY OF THE INVENTION

It is an object of the invention to provide a measuring transformer arrangement for making voltage and current measurements in a high-voltage, metal-encapsulation carrying several high-voltage conductors which is both effective and of simple configuration.

The measuring transformer arrangement according to the invention is suitable for use in a gas-insulated or liquid-insulated, high-voltage installation with a metal encapsulation carrying several conductors. Capacitor bushings are provided for each of the high-voltage conductors and are arranged in a bulkhead partition of the metal encapsulation. At their periphery, the capacitor bushings carry as devices for the current measurement at least one current transformer core each, with a secondary winding system mounted thereon.

The primary advantage of the measuring transformer arrangement according to the invention is that its installation in the metal encapsulation of a high-voltage switching installation is relatively simple because capacitor bushings for the feedthrough of the high-voltage conductors already exist in the bulkhead partition which is required in the installation. The means required for constructing the measuring transformer arrangement according to the invention are therefore relatively modest.

The devices for measuring the voltages may be configured in different ways, for example, they may consist of a semiconductor arrangement for the measurement of voltage such as is known from the above-mentioned Czechoslovakian Pat. No. 437,521. However, it is considered as particularly advantageous if, for each bushing, the device for measuring the voltage consists of a capacitor connected to a control electrode in the capacitor bushing, the capacitor, being a low-potential capacitor and followed by an amplifier. The control electrode surrounds the high-voltage conductor and conjointly defines therewith a high-potential capacitor. The high-potential capacitor and the low-potential capacitor conjointly define a capacitive voltage divider. With such a configuration of the device for the voltage measurement, no semiconductor arrangement is required; rather, a control electrode necessary for the control of the voltage in the capacitor bushing is utilized also to form a high-potential capacitor. The production of a measuring transformer provided with such a device for measuring the voltage in accordance with the invention is therefore especially cost-effective.

Especially if the high-voltage installation, which is to be equipped with the measuring transformer according to the invention, is a gas-insulated installation, the capacitor bushings are advantageously made as cast resin bushings, each with an embedded control electrode and two grounded guard ring-electrodes on either side of the control electode. In gas-insulated switching installations, the use of cast resin bushings has the advantage that a gastight seal is established in the area of the capacitor bushings in the bulkhead partition and the performance of the bulkhead partition is not affected.

Although the invention is illustrated and described herein as a measuring transformer with a capacitor bushing, it is nevertheless not intended to be limited to the details shown, since various modifications may be made therein within the scope and the range of the claims. The invention, however, together with additional objects and advantages will be best understood from the following description and in connection with the accompanying drawings.

BRIEF DESCRIPTION OF THE DRAWINGS

FIG. 1 is a schematic diagram showing a transverse view of the measuring transformer arrangement according to the invention arranged in a metal encapsulated, high-voltage installation.

FIG. 2 is a schematic diagram, partially in section, showing the voltage transformer and the current transformer of the measuring transformer arrangement according to the invention.

DESCRIPTION OF THE PREFERRED EMBODIMENTS OF THE INVENTION

Referring to the drawing, three capacitor bushings 4, 5 and 6 are arranged in a bulkhead partition 1 of a metal encapsulation 2 of a high-voltage installation 3 which can be, for example, a high-voltage switching installation. The capacitor bushings 4 to 6 are made as cast resin bushings and each contains a control electrode 7 and guard ring-electrodes 8 and 9 on either side of the control electrode 7; the control electrode 7 as well as the guard ring-electrodes 8 and 9 represent cylindrical electrodes and are embedded in the cast resin bushings 4 to 6.

Together with the high-voltage conductors 10, 11 and 12 contained in the capacitor bushings 4, 5 and 6, the control electrodes form respective high-potential capacitors. For the capacitor bushing 4, this capacitor is shown in equivalent circuit form by a broken-line. The control electrode 7 is connected by means of a lead 13 with a low-voltage capacitor 14 arranged outside the metal encapsulation. The high-potential capacitor and a low-potential capacitor conjointly define a capacitive voltage divider. The guard ring-electrodes 8 and 9 are grounded by being connected to a mounting ring 15 supported by each of the capacitor bushings 4 to 6; this mounting ring 15 is attached at the bulkhead partition 1 which, due to its connection with the grounded metal encapsulation 2, is also grounded. An amplifier 16, which is followed by a load 17, is connected to the low-potential capacitor 14. The load 17 may represent a measuring device or a protective device.

The other two capacitor bushings 5 and 6 are equipped with corresponding devices for the measurement of voltage.

The embodiment illustrated in FIGS. 1 and 2 includes a device for measuring current which includes a current transformer core 18 with a secondary winding system 19 mounted thereon, and a further current transformer core 20 with a secondary winding system 21 mounted thereon. The current transformer cores of the kind designated by 18 and 20 are supported on each of the capacitor bushings 4 and 6, respectively. The ends of the secondary winding systems 19 and 21 are brought outof the metal encapsulation 2; these winding ends are not shown in the drawing to provide clarity.

The measuring transformer arrangement according to the invention is suitable for a high-voltage installation such as a switching installation equipped with a metal encapsulation carrying several high-voltage conductors. The measuring transformer arrangement according to the invention affords the capability, with relatively modest means, of measuring currents and voltages in or on the high-voltage conductors of the high-voltage installation.

What is claimed is:

1. In a high-voltage, fluid-insulated switching installation having a metal enclosure and containing a plurality of high-voltage conductors, the metal enclosure including at least one metal bulkhead for dividing the metal enclosure into separate compartments and extending transverse to the conductors, a measuring transformer arrangement comprising: a plurality of feedthrough bushings mounted in the bulkhead and corresponding to respective ones of the high-voltage conductors for accommodating the same at the bulkhead; a plurality of voltage detection devices for detecting the voltage on corresponding ones of the high-voltage conductors, each of said voltage detection devices including capacitor means disposed in the bushing associated with the corresponding high-voltage conductor; and a plurality of current detection devices for detecting the current in corresponding ones of the high-voltage conductors, each of the current detection devices including a transformer unit arranged on the outer surface of the bushing associated with the corresponding high-voltage conductor, each of said current transformer units including a current transformer core, and a secondary winding system mounted on said core.

2. The measuring transformer arrangement of claim 1, said capacitor means for each of said voltage detection devices comprising a control electrode arranged in the corresponding feedthrough bushing so as to be in surrounding relation to the high-voltage conductor accommodated therein, said control electrode and the high-voltage conductor conjointly defining a high-voltage capacitor; and, said voltage detection device further including a low-voltage capacitor connected to said control electrode; said high-voltage capacitor and said low-voltage capacitor conjointly defining a voltage divider.

3. The measuring transformer arrangement of claim 2, said voltage detection device including an amplifier connected across said low-voltage capacitor.

4. The measuring transformer arrangement of claim 2, the feedthrough bushing corresponding to said voltage detection device being made of cast resin, said control electrode being embedded in said feedthrough bushing; and grounded guard ring-electrodes embedded in said bushing and disposed on respective ends of said control electrode.

5. A measuring transformer arrangement suitable for installation in a fluid-insulated, high-voltage equipment such as in a high-voltage switching installation or the like having a metal enclosure and containing a plurality of high-voltage conductors, the metal enclosure including at least one bulkhead extending transverse to the high-voltage conductors, the measuring transformer arrangement comprising: a plurality of cast resin feedthrough bushings corresponding to respective ones of the high-voltage conductors for accommodating the same at the bulkhead; a plurality of voltage detection devices for detecting the voltage on corresponding ones of the high-voltage conductors, each of said voltage detection devices including capacitor means disposed in the bushing associated with the corresponding high-voltage conductor; a plurality of current detection devices for detecting the current in corresponding ones of the high-voltage conductors, each of the current detection devices including a transformer unit arranged on the outer surface of the bushing associated with the corresponding high-voltage conductor, each of said current transformer units including a current transformer core, and a secondary winding system mounted on said core; said capacitor means for each of said voltage detection devices comprising a control electrode arranged in the corresponding feedthrough bushing so as to be in surrounding relation to the high-voltage conductor accommodated therein, said control electrode and the high-voltage conductor conjointly defining a high-voltage capacitor; and, said voltage detection device further including a low-voltage capacitor connected to said control electrode; said high-voltage capacitor and said low-voltage capacitor conjointly defining a voltage divider, said control electrode being embedded in said cast resin feedthrough bushing; and grounded guard ring-electrodes embedded in said bushing and disposed on respective ends of said control electrode, said voltage detection device including an amplifier connected across said low-voltage capacitor.

6. The measuring transformer arrangement of claim 4, said guard-ring electrodes being connected directly to the metal bulkhead.

* * * * *